United States Patent
Wyse

(10) Patent No.: US 6,230,001 B1
(45) Date of Patent: May 8, 2001

(54) ACTIVE COMMUTATED DOUBLE BALANCED MIXER

(75) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/320,786

(22) Filed: May 27, 1999

(51) Int. Cl.$^7$ .................................................. H04B 1/26
(52) U.S. Cl. ........................ 455/326; 455/333; 327/357; 332/178
(58) Field of Search .................................... 455/326, 333, 455/323, 313; 327/116, 119, 356, 357; 332/105, 159, 178

(56) References Cited

U.S. PATENT DOCUMENTS

| | | | |
|---|---|---|---|
| 4,268,916 | * 5/1981 | Kusakabe | 455/333 |
| 4,704,738 | * 11/1987 | Graziadei et al. | 455/326 |
| 5,847,623 | * 12/1998 | Hadjichristos | 455/333 |
| 6,026,286 | * 2/2000 | Long | 455/333 |

OTHER PUBLICATIONS

"Single Sideband Systems And Circuit", McGraw Hill, Second Edition, pp. 149–155, William E. Sabin and Edgar O. Schoenike.

* cited by examiner

Primary Examiner—Doris H. To
(74) Attorney, Agent, or Firm—Nathan O. Jensen; Kyle Eppele; J. P. O'Shaughnessy

(57) ABSTRACT

A transistor commuted double balanced mixer that uses a Gilbert cell mixer quad transistor core. The RF input differential pair is deleted from the standard Gilbert cell mixer configuration. A transformer is used to apply the RF input through resistors to the Gilbert cell mixer quad transistor core.

4 Claims, 3 Drawing Sheets

ACTIVE COMMUTATED DOUBLE BALANCED MIXER

BACKGROUND OF THE INVENTION

This invention relates to radio communications equipment and more specifically to radio frequency (RF) mixers used in RF equipment.

Radio communications equipment use mixers to convert a signal from a low frequency to a high frequency or a high frequency to a low frequency by mixing the signal with a local oscillator signal. The local oscillator frequency can be above or below the frequency of the desire signal to produce a sum and a difference frequency one of which is the frequency of interest.

Mixer performance is critical to the overall performance of the RF equipment. Mixer performance is especially critical in receiver applications where the dynamic range of the receiver is limited by the mixer. Mixers must have good linearity or intermodulation performance characteristics, wide dynamic range, low power consumption, low noise figure, and offer conversion gain in some applications.

Direct conversion or homodyne receivers convert the RF signal directly to baseband or a zero intermediate frequency (IF). Mixers for this application require low second or even-order distortion products, good balance, and low 1/f noise. Diode ring mixers are not suitable for direct conversion receiver applications since they have poor balance, require high injection levels, and have a conversion loss. Active mixers such as the Gilbert cell fabricated in gallium arsenide (GaAs) heterojunction bipolar transistor (HBT) technology offer some performance advantages over passive diode mixers. However these active mixer designs are expensive and suffer from 1/f noise problems and other low frequency discrete noise spurs due to GaAs processing issues. These mixers also have high power consumption and larger than desired noise figures.

What is needed for direct conversion and other receiver applications is a mixer that has no anomalous low frequency spurs, has low distortion, has significantly reduced power consumption, lower noise figure, good balance, and low cost.

SUMMARY OF THE INVENTION

An active commutated double balanced mixer is disclosed. The active commutated double balanced mixer comprises a transformer with a primary connected to an RF input signal to be up or down converted and a secondary with a center tap connected to ground. A first resistor is used with a first end connected to a first end terminal of the transformer secondary. A second resistor is used with a first end connected to a second end terminal of the transformer secondary. A quad transistor core is connected to a second end of the first resistor and a 180 degree out of phase RF input connected to a second end of the second resistor, a local oscillator input, a power supply input, and an intermediate frequency output.

It is an object of the present invention to provide a mixer that has low intermodulation distortion, reduced power consumption, good balance, and good amplitude modulation (AM) demodulation performance.

It is an advantage of the present invention that bipolar junction transistor and field effect transistor technology can be used.

It is an advantage of the present invention that silicon bipolar junction transistor technology is utilized to lower cost.

It is another advantage of the present invention using silicon bipolar junction transistor technology that spurious low frequency noise is reduced.

It is a feature of the present invention to provide the performance needed for direct conversion receiver applications.

DETAILED DESCRIPTION

Radio frequency (RF) mixers are know in the art for up-converting a baseband signal to a high frequency or down-converting a high frequency signal to baseband. There are many mixer types such as unbalanced, single and double balanced. Mixers can be passive diode or active transistor types using various semiconductor technologies such as silicon and gallium arsenide with bipolar junction transistors (BJT), field effect transistors (FET), or other variations of these types.

Figure 1:
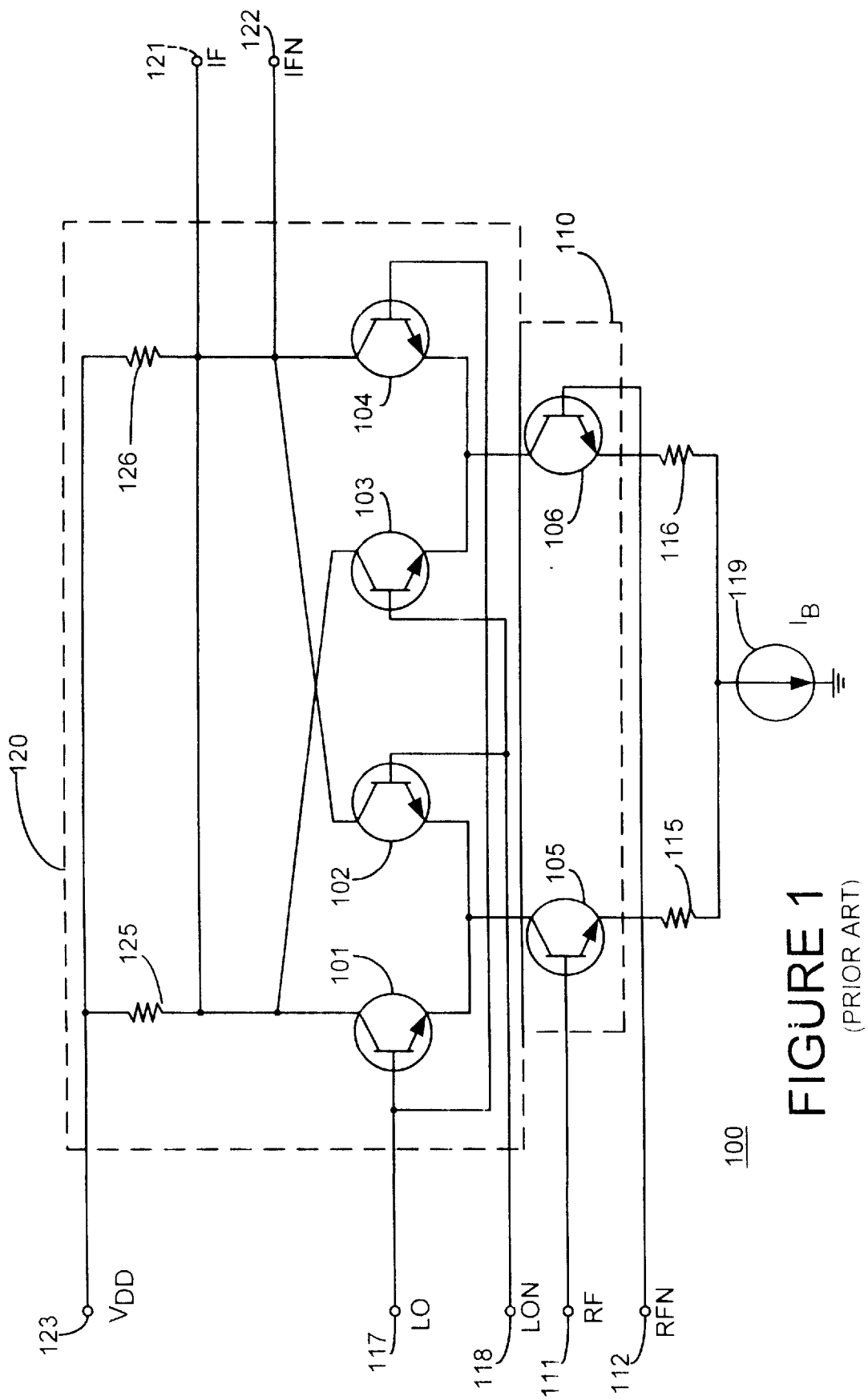
FIG. 1 is diagram of a standard Gilbert cell mixer known in the art.

One type of mixer known in the art is the Gilbert cell mixer 100 shown in FIG. 1. The Gilbert cell mixer 100 provides conversion gain, good rejection at the RF and LO ports, and a differential IF output. The Gilbert cell mixer 100 is the preferred choice for integrated circuit mixer designs and is shown in FIG. 1 implemented in bipolar junction transistors. The Gilbert cell mixer 100 is a double balanced switching or commutating mixer using a differential pair of transistor 105 and 106 in the RF differential cell 110 to drive the mixer quad transistor core 120 consisting of transistors 101, 102, 103, and 104 and collector resistors 125 and 126. Transistors 101 and 102 form a differential pair as do 103 and 104.

In FIG. 1, the RF input signal to be up or down converted is fed into the bases of the differential pair 105 and 106 in the RF differential cell 110. The RF signal (RF) at the input terminal 111 connected to the base of 105 is 180 degrees out of phase to RF signal (RFN) at the input terminal 112 connected to the base of 106. A transformer (not shown) can provide this phase shift. The RF signal and the 180-degree phased shifted RF signal from the output of the differential pair 105 and 106 are then applied to the mixer quad transistor core 120 at the in-phase and out-of-phase inputs at the emitters of the transistor differential pairs 101/102 and 103/104 respectively. The local oscillator signal (LO) to be mixed with the RF signal is connected to input terminal 117 and fed to the base of transistor 101 and 104 and the 180-degree phase shifted local oscillator (LON) is connected to input terminal 118 and fed to the bases of transistor 102 and 103. Another transformer (not shown) can provide this phase shift input. The up or down converted IF signal is taken from terminal 121 (IF) connected to the collectors of transistor 101 and 103 and the 180-degree IF signal (IFN) from terminal 122 connected to the collectors of transistor 102 and 104. Power is supplied to the mixer at Vdd terminal 123 and bias through current source Ib 119.

The mixer quad transistor core 120 and the RF differential cell 110 determine the overall intermodulation performance. The dominant cause of distortion is due to the RF differential cell 110. To improve the linearity of the mixer, the emitter degeneration resistors 115 and 116 must increase in value or the current Ib 119 must increase. However increasing the emitter resistors 115 and 116 increases the noise and increasing the current in the current source Ib 119 increases the power consumption.

Figure 2:
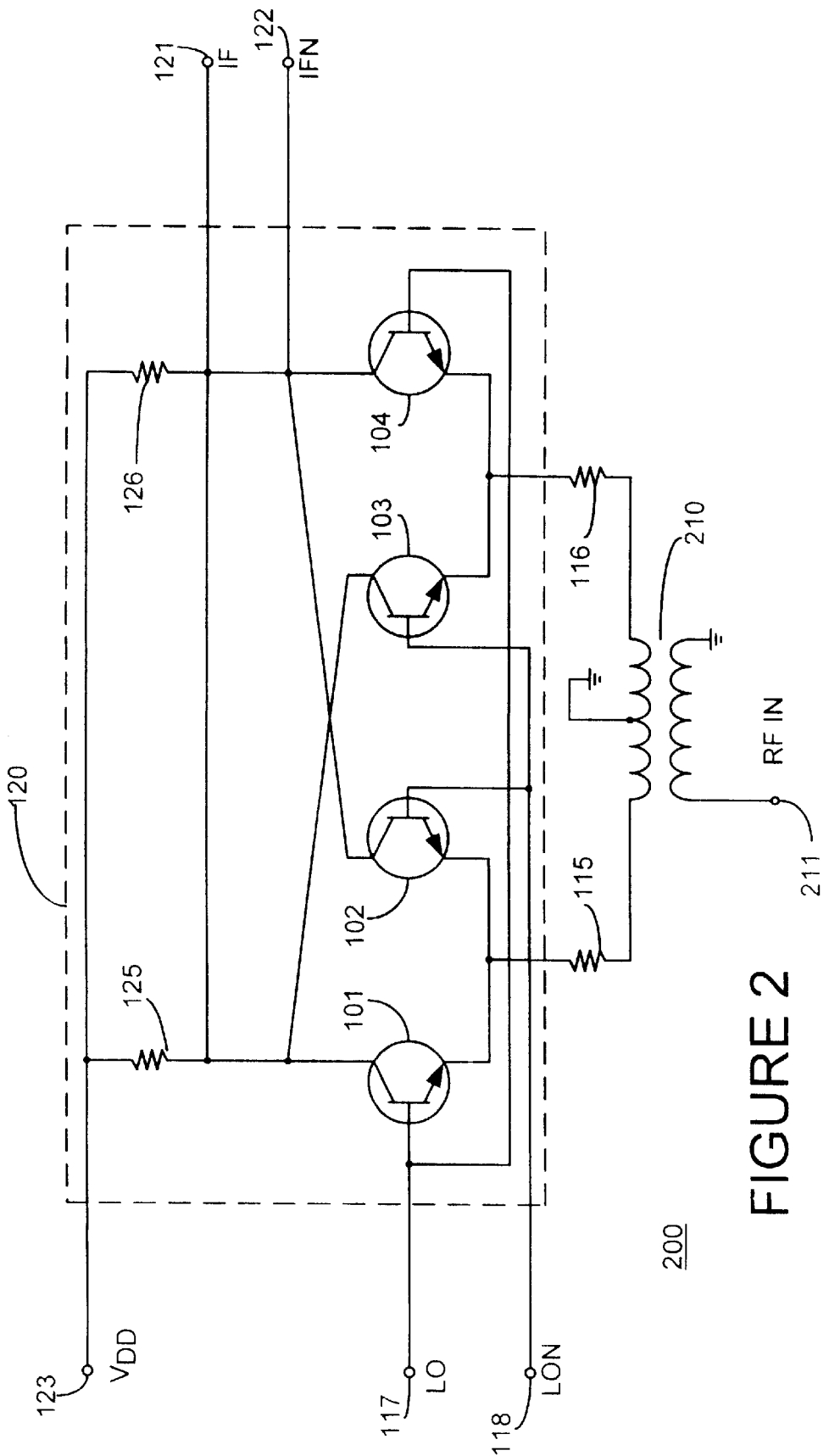
FIG. 2 is a diagram of mixer according to the present invention.

A novel active commutated double balanced mixer topology is created by eliminating the non-linearity of the RF differential cell 110 by eliminating the RF differential cell 110 consisting of transistors 105 and 106. The mixer of the present invention is shown in FIG. 2 as 200 implemented in bipolar junction transistors. Transistor 105 and 106 of FIG. 1 are eliminated and a transformer 210 is added as shown in FIG. 2. The RF input is connected to terminal 211 of the primary of transformer 210. The other primary terminal of transformer 210 is connected to ground. The first secondary terminal of transformer 210 is connected to the first end of first resistor 115, the second secondary terminal of transformer 210 is connected to first end of second resistor 116 and the center tap is connected to ground. With the elimination of transistor 105 and 106, the second ends of resistor 115 and 116 are now connected directly to the emitters or first terminals of transistors 101 and 102 and 103 and 104 respectively of the mixer quad transistor core 120. The local oscillator (LO) and intermediate frequency (IF) connections to the mixer quad are as in the standard Gilbert cell mixer 100 of FIG. 1. The LO input (LO) is connected to terminal 117, which is connected to the bases or second terminals of transistors 101 and 104. The 180-degree phase shifted LO input (LON) is connected to terminal 118, which is connected to the base or second terminals of transistor 102 and 103. The IF output (IF) at terminal 121 is taken from the collectors or third terminals of transistors 101 and 103. The 180-degree phase shifted IF output (IFN) at terminal 122 is taken from the collectors or third terminals of transistors 102 and 104. The first end of the third resistor 125 is connected to the collectors of transistors 101 and 103. The second end of the third resistor 125 is connected to power source Vdd at terminal 123. The first end of the fourth resistor 126 is connected to the collectors of transistors 102 and 104. The second end of the fourth resistor 126 is connected to the power source Vdd at terminal 123.

The mixer of the present invention 200 is shown in FIG. 2 as being implemented in bipolar junction transistors and these transistors can be silicon or some other similar semiconductor material. The first resistor 115 and second resistor 116 are emitter resistors and the third resistor 125 and fourth resistor 126 are collector resistors when bipolar junction transistors are used. The transistors 101, 102, 103, and 104 can also be heterojunction bipolar transistors (HBT) implemented in gallium arsenide (GaAs) or some other similar semiconductor material. The transistors 101, 102, 103, and 104 can also be field effect transistors where the sources are connected in place of the emitters as the first terminal, the gates are connected in place of the bases as the second terminal, and the drains are connected in place of the collectors as the third terminal of the corresponding bipolar junction transistors. The field effect transistors can be silicon junction field effect transistors, gallium arsenide field effect transistors (GaAsFET), metallic semiconductor field effect transistors (MESFET), pseudomorphic high electron mobility transistors (PHEMT). The first resistor 115 and second resistor 116 are source resistors and the third resistor 125 and fourth resistor 126 are drain resistors when field effect transistors are used.

Figure 3:
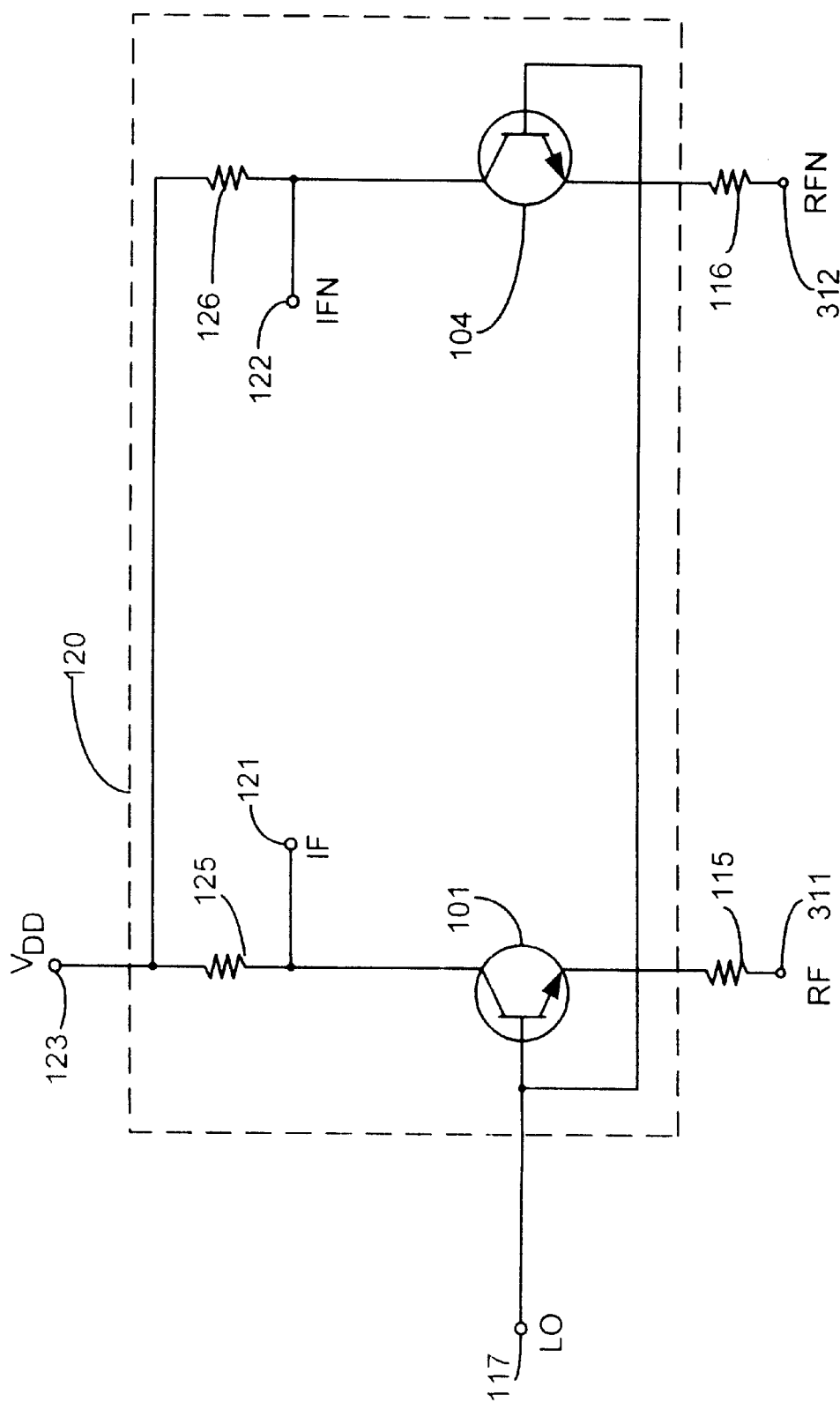
FIG. 3 is a diagram the RF differential half-circuit of the quad transistor cell shown in FIG. 3.

The RF differential half circuit of the mixer is shown in FIG. 3 implemented in bipolar junction transistors for this example. The RF signal from transformer 210 in FIG. 2 is applied in-phase (RF) at terminal 311 and out-of-phase (RFN) at terminal 312 in FIG. 3. The LO in-phase signal (LO) is connected to the base of transistor 101 and 104 at terminal 117 in FIG. 3. The LO out-of-phase signal (LON) is connected to the base of transistor 102 and 103 at terminal 118 as shown in FIG. 2. The bases of 101 and 104 are at AC ground when the LO signal is high thus 101 and 104 appear to be a common base stage. The out-of-phase LON signal turns off the other transistor pair 102 and 103. The input impedance at the emitter of 101 or 104 is 1/gm and the input impedance to the RF signal at terminals 311 and 312 is 1/gm+Re, where gm is the transistor transconductance and Re is the value of the emitter resistors 115 and 116. The input impedance becomes approximately equal to Re in high linearity applications. The gain Vg of the half circuit is given by equation 1 below.

$$Vg = +\frac{gmR1}{1+gmRe} \sim \frac{+R1}{Re} \qquad \text{Equation 1}$$

R1 is the value of the collector resistors 125 and 126. The new circuit still has the same common mode rejection of a differential amplifier as with the Gilbert cell mixer. The resistive feedback provided by emitter resistors 115 and 116 provides good linearity. Power is greatly reduced with the removal of the differential amplifiers 105 and 106 and the current source Ib 119 of FIG. 1.

It is believed that the active commutated double balanced mixer of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An active double balanced mixer comprising:

a transformer having a primary with a first end terminal connected to an RF input signal and a second end terminal to ground and a secondary with a center tap connected to ground;

a first resistor having a first end connected to a first end terminal of the transformer secondary;

a second resistor having a first end connected to a second end terminal of the transformer secondary;

a first transistor with a first terminal connected to a second end of the first resistor and a second terminal connected to a local oscillator signal;

a second transistor with a first terminal connected to the second end of the first resistor and a second terminal connected to a 180-degree phase shifted local oscillator signal;

a third transistor with a first terminal connected to a second end of the second resistor and a second terminal connected to the 180-degree phase shifted local oscillator signal;

a fourth transistor with a first terminal connected the second end of the second resistor and a second terminal connected to the local oscillator signal;

a third resistor with a first end connected to a third terminal of the first transistor and the third transistor and an IF output, and a second end connected to a power source; and a fourth resistor with a first end connected to a collector of the second transistor and the fourth transistor and a 180-degree phase IF output, and a second end connected to the power source.

2. The mixer of claim 1 wherein the transistors are selected from the group consisting of bipolar junction transistors, heterojunction bipolar transistors, junction field effect transistors, gallium arsenide field effect transistors, metallic semiconductor field effect transistors, and pseudomorphic high electron mobility transistors.

3. An active commutated double balanced mixer comprising;

a transformer having a primary connected to an RF input signal and a secondary with a center tap connected to ground;

a first resistor having a first end connected to a first end terminal of the transformer secondary;

a second resistor having a first end connected to a second end terminal of the transformer secondary; and a quad transistor core having an RF input connected to a second end of the first resistor and a 180-degree out-of-phase RF input connected to a second end of the second resistor, a local oscillator input, a power supply input, and an intermediate frequency output.

4. The mixer of claim 3 wherein the transistors are selected from the group consisting of bipolar junction transistors, heterojunction bipolar transistors, junction field effect transistors, gallium arsenide field effect transistors, metallic semiconductor field effect transistors, and pseudomorphic high electron mobility transistors.

* * * * *